(12) United States Patent
Lal et al.

(10) Patent No.: US 11,923,804 B2
(45) Date of Patent: Mar. 5, 2024

(54) CMOS INTEGRATED TEMPERATURE INSENSITIVE, STABLE, AND CALIBRATED OSCILLATOR

(71) Applicants: GEEGAH LLC, Ithaca, NY (US); Amit Lal, Ithaca, NY (US); Justin Kuo, Ithaca, NY (US)

(72) Inventors: Amit Lal, Ithaca, NY (US); Justin Kuo, Ithaca, NY (US)

(73) Assignee: Geegah, LLC, Ithaca, NY (US)

( * ) Notice: Subject to any disclaimer, the term of this patent is extended or adjusted under 35 U.S.C. 154(b) by 173 days.

(21) Appl. No.: 17/637,321

(22) PCT Filed: Aug. 21, 2020

(86) PCT No.: PCT/US2020/047468
§ 371 (c)(1),
(2) Date: Feb. 22, 2022

(87) PCT Pub. No.: WO2021/035166
PCT Pub. Date: Feb. 25, 2021

(65) Prior Publication Data
US 2022/0294390 A1  Sep. 15, 2022

Related U.S. Application Data

(60) Provisional application No. 62/889,887, filed on Aug. 21, 2019.

(51) Int. Cl.
*H03B 5/04* (2006.01)
*G01B 17/02* (2006.01)
(Continued)

(52) U.S. Cl.
CPC .............. *H03B 5/04* (2013.01); *G01B 17/02* (2013.01); *G01N 29/2437* (2013.01);
(Continued)

(58) Field of Classification Search
CPC .......... H03B 5/04; H03B 5/326; G01B 17/02; G01N 29/2437; G01N 29/348;
(Continued)

(56) References Cited

U.S. PATENT DOCUMENTS

| | | | |
|---|---|---|---|
| 5,991,234 A | 11/1999 | Sejalon et al. | |
| 6,414,627 B1 * | 7/2002 | McEwan | G01S 13/0209 342/134 |

(Continued)

FOREIGN PATENT DOCUMENTS

| | | |
|---|---|---|
| DE | 4120397 A1 | 12/1992 |
| WO | 2019152961 A1 | 8/2019 |

OTHER PUBLICATIONS

Wireless Wearable Ultrasound Sensor on a Paper Substrate to Characterize Respiratory Behavior Chen et al., NPL: ACS Sens. 2019,4,4,944-952 Pub Date Mar. 11, 2019 (Year: 2019).*

(Continued)

*Primary Examiner* — Arnold M Kinkead
(74) *Attorney, Agent, or Firm* — George R. McGuire

(57) ABSTRACT

A temperature insensitive oscillator system. The system includes a substrate having a first surface and an opposing second surface, a CMOS device with one or more CMOS circuits attached to the first surface of the substrate, one or more piezoelectric transducers attached to an outer surface of the CMOS device, a voltage-controlled oscillator generating a RF frequency, which is transmitted as a plurality of short pulses to the one or more piezoelectric transducers, and one or more delays and oscillators using resistor and active components arranged alongside the piezoelectric transducers or on the CMOS device such that the voltage-controlled oscillator has minimal dependence on temperature, and has minimal deviation from a programmed frequency.

20 Claims, 12 Drawing Sheets

(51) Int. Cl.
*G01N 29/24* (2006.01)
*G01N 29/34* (2006.01)
*G01N 29/44* (2006.01)
*G04G 3/04* (2006.01)
*H03L 1/02* (2006.01)

(52) U.S. Cl.
CPC ....... *G01N 29/348* (2013.01); *G01N 29/4409* (2013.01); *G04G 3/04* (2013.01); *H03L 1/022* (2013.01); *H03L 1/028* (2013.01); *G01N 2291/02854* (2013.01); *G01N 2291/2697* (2013.01)

(58) Field of Classification Search
CPC ..... G01N 29/4409; G01N 2291/02854; G01N 2291/2697; G04G 3/04; H03L 1/022; H03L 1/028; H03L 7/26
USPC ............ 331/158, 116 FE; 342/134; 324/637, 324/71.1; 73/632, 624
See application file for complete search history.

(56) References Cited

U.S. PATENT DOCUMENTS

| | | |
|---|---|---|
| 2004/0130400 A1 | 7/2004 | Rusu et al. |
| 2005/0068114 A1 | 3/2005 | Liu |
| 2005/0231297 A1 | 10/2005 | Aparin et al. |
| 2006/0192973 A1 | 8/2006 | Aiyer et al. |
| 2012/0313678 A1 | 12/2012 | Felix et al. |
| 2014/0293818 A1 | 10/2014 | Sesia et al. |
| 2015/0358026 A1* | 12/2015 | Gan .......................... H03L 7/26 |
| | | 331/94.1 |

OTHER PUBLICATIONS

International Search Report and Written Opinion, PCT/US2020/047468, dated Feb. 3, 2021.

* cited by examiner

CMOS INTEGRATED TEMPERATURE INSENSITIVE, STABLE, AND CALIBRATED OSCILLATOR

CROSS-REFERENCE TO RELATED APPLICATIONS

The present application is the U.S. National Stage Application under 35 U.S.C. 371 of PCT Application No. PCT/US20/47468, filed Aug. 21, 2020, which claims priority to U.S. Provisional Application No. 62/889,887 filed on Aug. 21, 2019, the entirety of each of which is hereby incorporated by reference in its entirety.

GOVERNMENT FUNDING

This invention was made with government support under Award No. 1746710 awarded by the National Science Foundation (NSF). The government has certain rights in the invention.

BACKGROUND OF THE INVENTION

1. Field of the Invention

The present invention generally relates to a piezoelectric transceiver apparatus and, more particularly, to a CMOS device integrated with a temperature insensitive, stable, and calibrated oscillator.

2. Description of Related Art

Recent work (PCT/US20/35537 assigned to the assignee hereof and incorporated herein by reference) has demonstrated the concept of sending short ultrasonic pulses through a silicon wafer to realize an oscillator. Planar thin-film piezoelectric transducers are used to transmit and receive the pulses. The transit time between the transmit and receive transducers is proven to be stable over time owing to low loss of ultrasonic energy in high-quality crystals. For the very same reason resonators made of high-quality materials are used to achieve high-quality factor, the pulse-transmit of ultrasonic pulses results in stable time-of-flight. Once the time-of-flight has been stabilized, the stable delay can be used to form an oscillator.

The piezoelectric transducers are fabricated on top of a CMOS wafer or can be built on planar silicon and non-silicon substrates. Integration with CMOS wafers offers the pathway to integrate clocks and oscillators directly into circuits, eliminating the need for an external resonator structure employed in current systems. One can also use a separate CMOS electronics chip and a separate ultrasonic pulse-transit chips allows one to optimize the pulse-transit chips and the CMOS circuits independently of each other, to provide different oscillators with combinations of CMOS chips and US transmit/receive chips.

The transmitted ultrasonic pulse undergoes diffraction, given that the aperture of the transducer is of finite width. Diffraction results in the distribution of the pulses in different angles from the transmitters. Owing to the different angles, the pulses travel along different lengths through the substrates, as they reflect off the backside of the substrate, to arrive at the receiver. For example, the pulses associated with the first order and second order diffraction peaks can result in two times of arrivals on the receive transducer. This concept was demonstrated recently and has produced a stable delay element with ~1-ppm stability. In a related work, this delay line is placed in an electronic oscillator and has resulted in an oscillator with 1-5 ppm stability.

While the stability of an oscillator is important to maintain time and frequency to be expected over time, an equally important aspect is to maintain time and frequency independent of the temperature. For example, a typical specification for a clock for a microcontroller is 1-5 ppm variation over −45° to 125° C. The temperature independence ensures that the protocols of handshakes and clocking of computation across different blocks operating at different temperatures can still work together. The temperature coefficient for the delay and the oscillator reported in the previous work based on ultrasonic transmit and receive pulses can be substantial, except at a few values of temperature. Hence, a key challenge in the ultrasonic pulse T/R driven delay and oscillator architecture is to control the delay such that the total delay across an oscillator can be minimized over temperature. In addition to temperature insensitivity, a key challenge is to realize a fixed, desired frequency from the oscillator, in spite of fabrication dependent differences. A fixed frequency oscillator can then be used to generate different frequencies with devices such as phase locked loops, frequency multipliers, and frequency dividers, to obtain frequencies needed for RF communications.

Therefore, there is a need for a CMOS integrated clock generator and methods to reduce the delay temperature dependence, that can be set to a fixed frequency.

BRIEF SUMMARY OF THE INVENTION

In the invention described herein, a CMOS device integrated with a temperature insensitive, stable, and calibrated oscillator.

Embodiments of the present invention are directed to a temperature insensitive oscillator system. According to one aspect, the system includes a voltage-controlled oscillator VCO generating a RF frequency, which is transmitted as a plurality of short pulses to a piezoelectric transducer. The system also includes a piezoelectric receiver spaced from the piezoelectric transducer and configured to receive the plurality of short pulses, an envelope detector or a RF mixer configured to convert the plurality of short pulses to an amplified signal, and a comparator configured to digitize the amplified signal and add temperature-dependent and programmed fixed delays.

According to a similar aspect, the system includes a substrate having a first surface and an opposing second surface, a CMOS device with one or more CMOS circuits attached to the first surface of the substrate, one or more piezoelectric transducers attached to an outer surface of the CMOS device, a voltage-controlled oscillator generating a RF frequency, which is transmitted as a plurality of short pulses to the one or more piezoelectric transducers, and one or more resistors arranged alongside the piezoelectric transducers or on the CMOS device such that the voltage-controlled oscillator has a controllable temperature dependence.

According to an additional aspect, the system includes a substrate having one or more transducers and a first oscillator configured to generate a RF frequency which excites the one or more transducers at their respective resonance frequencies. The one or more transducers generate a first pulse and a second pulse, the second pulse having a difference from the first pulse. The delay generated from the US pulsing can be used to form two oscillators that can be used as clocks. In one clock architecture, one of the returning pulses is used to trigger then next transmit pulse resulting in an oscillator. The system also be used to implement a second oscillator having a frequency based on the time difference between the arrival times of two different received pulses.

These and other aspects of the invention will be apparent from and elucidated with reference to the embodiment(s) described hereinafter.

BRIEF DESCRIPTION OF THE SEVERAL VIEWS OF THE DRAWING(S)

The present invention will be more fully understood and appreciated by reading the following Detailed Description in conjunction with the accompanying drawings. The accompanying drawings illustrate only typical embodiments of the disclosed subject matter and are therefore not to be considered limiting of its scope, for the disclosed subject matter may admit to other equally effective embodiments. Reference is now made briefly to the accompanying drawings, in which.

Figure 7:
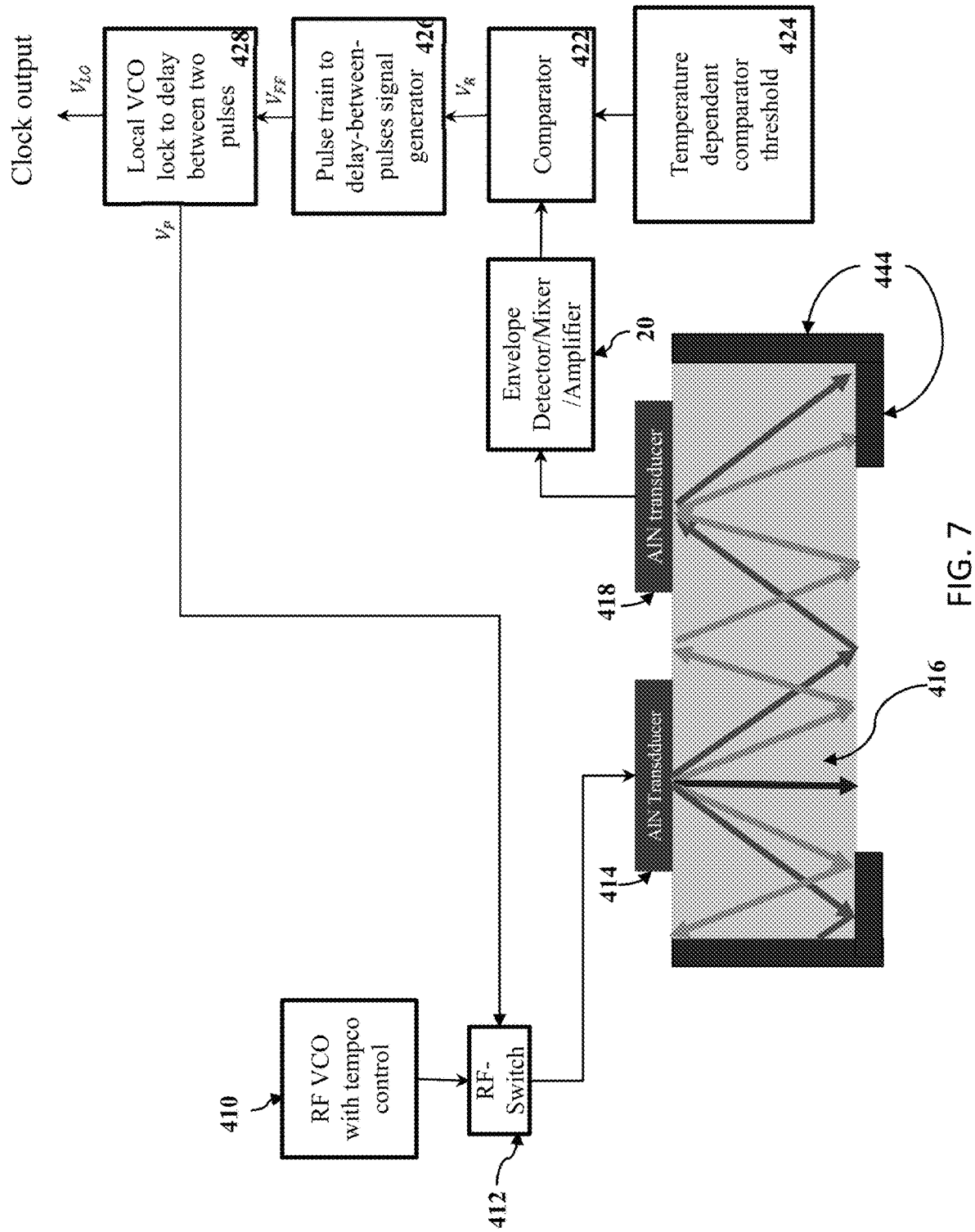
FIG. 7 is the architecture of a oscillator based on the time difference between two different pulses.
Figure 8:
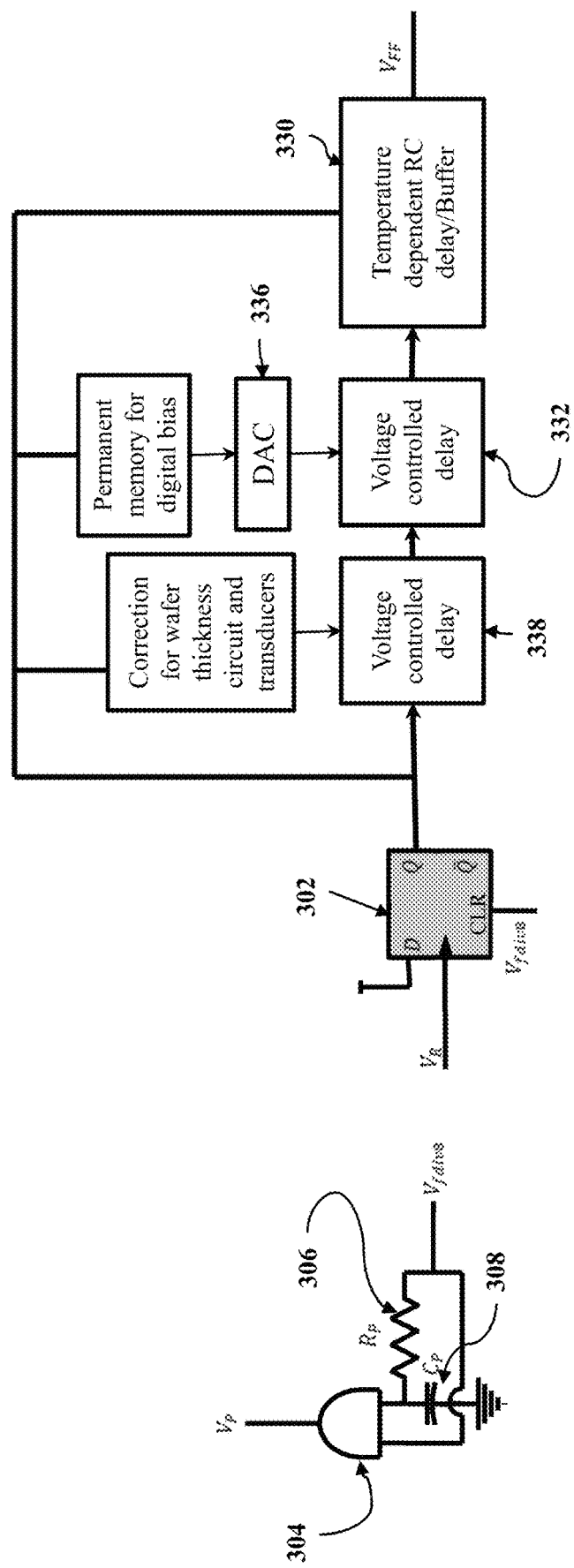
Figure 9:
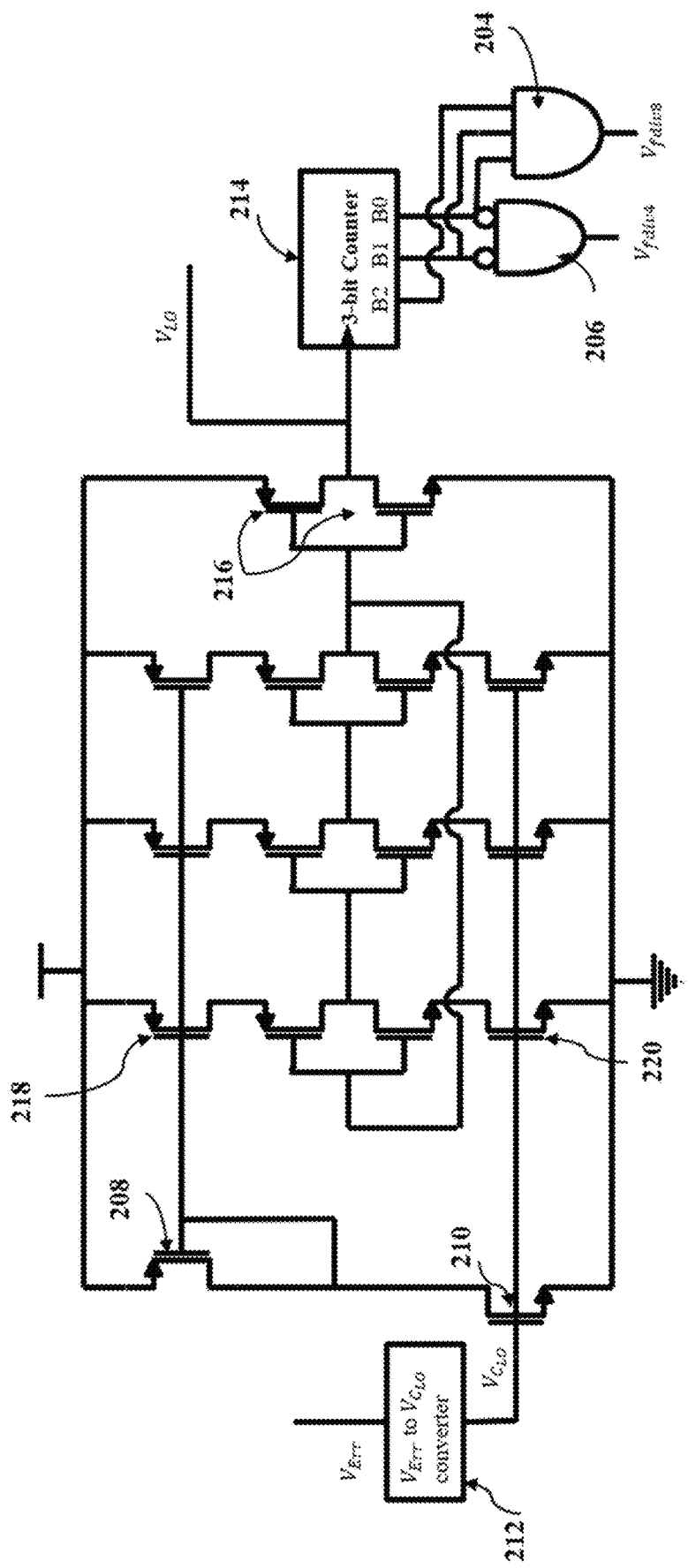
Figure 10:
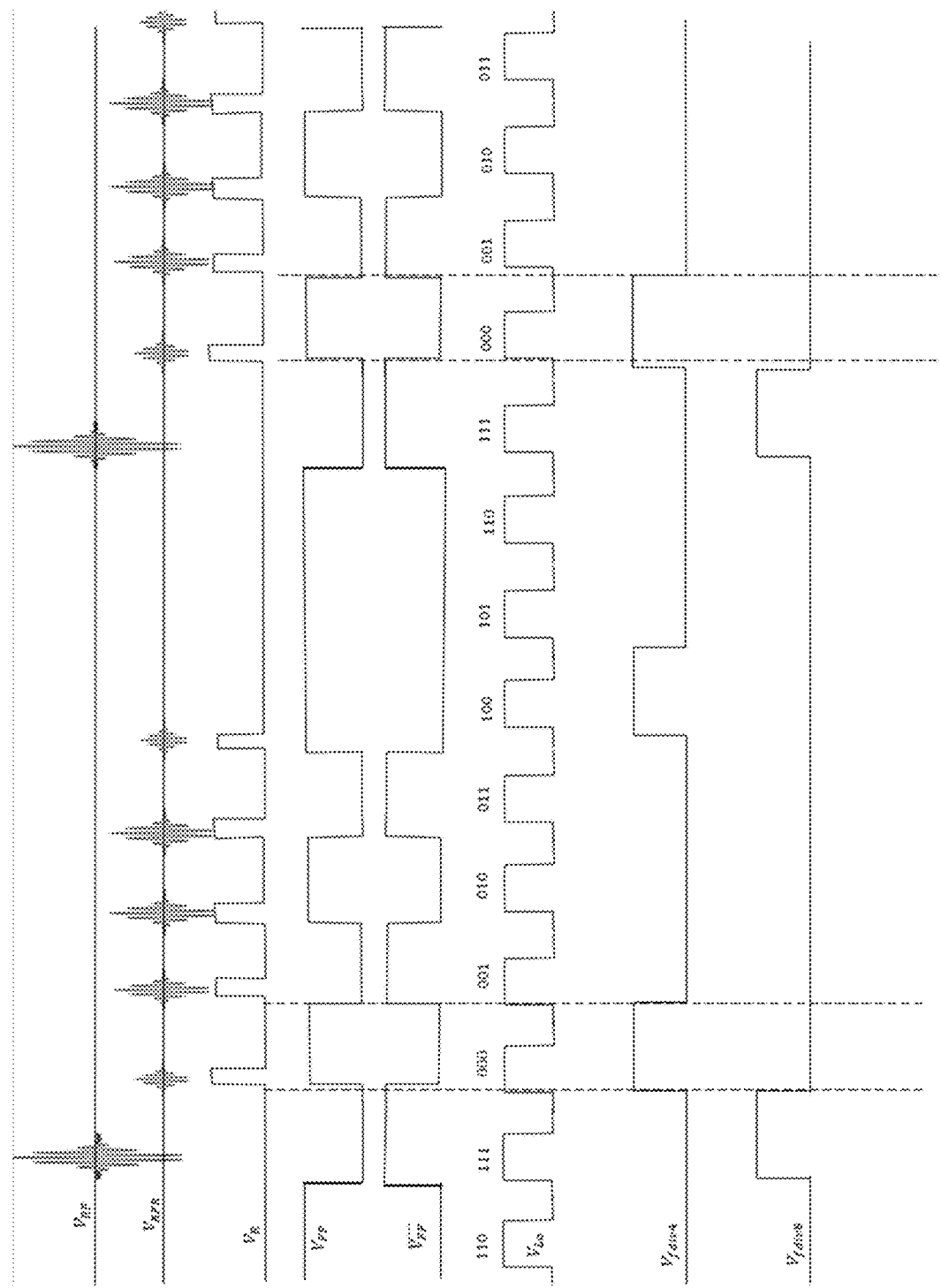
Figure 11:
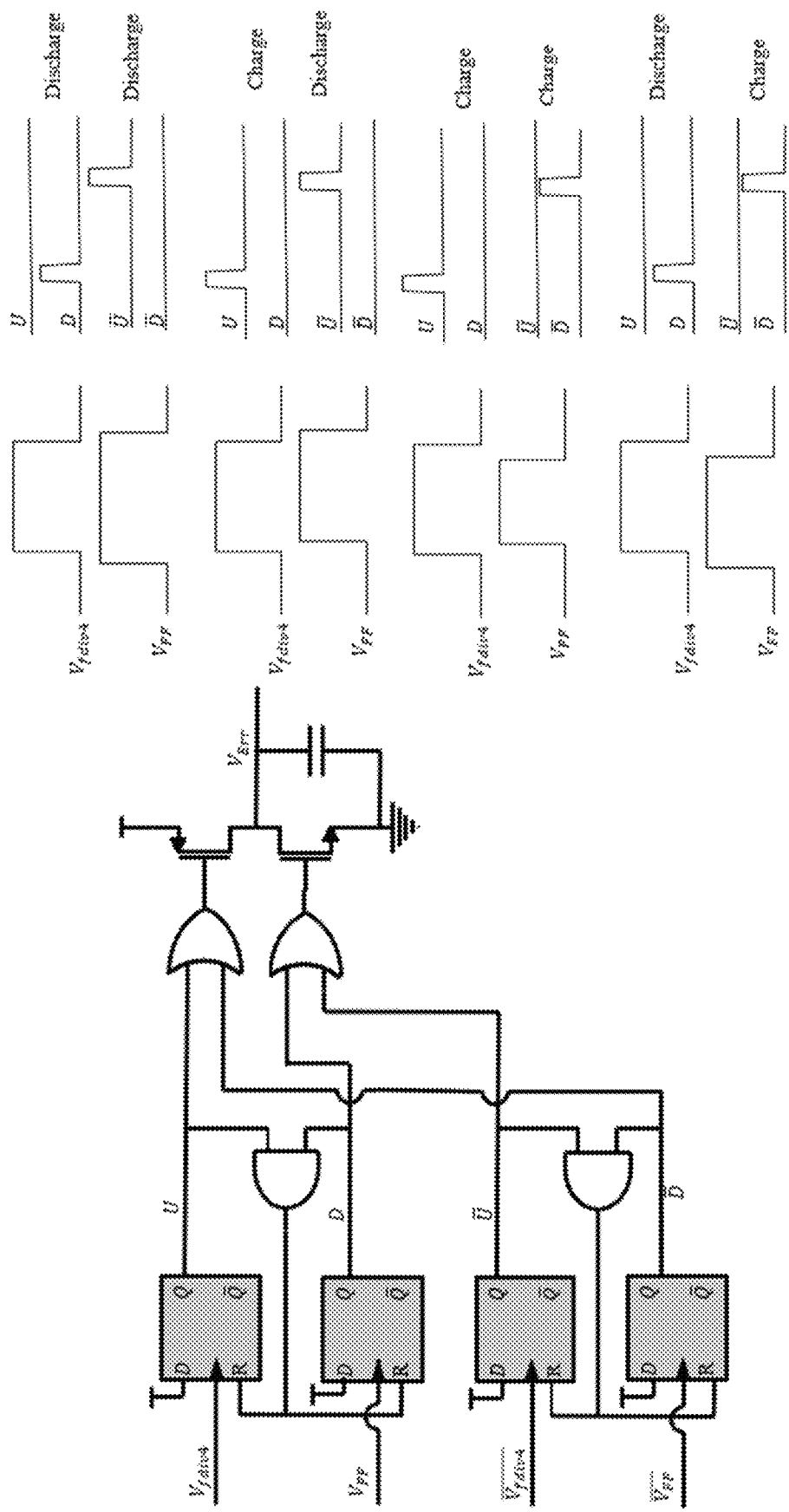
Figure 12:
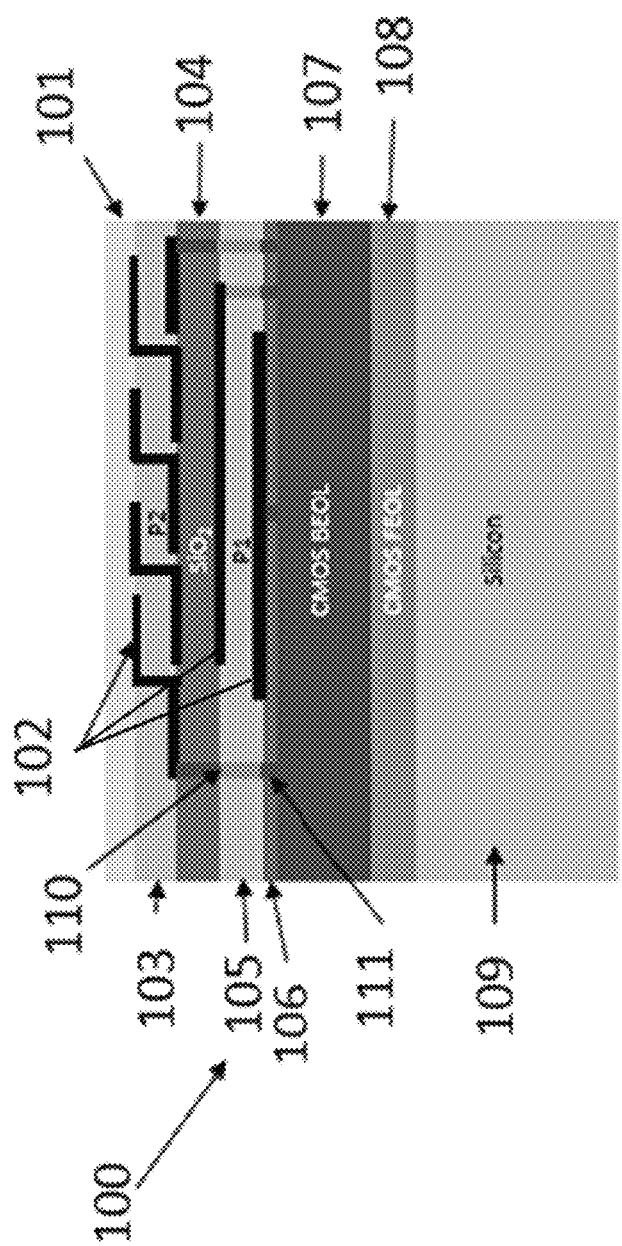

FIG. 8 demonstrates the generation of the RF pulse and method to generate a delay signal from the return pulses;

FIG. 9 is a schematic representation of an implementation of a local oscillator VCO that can be locked to the ultrasonic delay in silicon with the VCO output divided down to produce signals that can be used in the oscillator control loop;

FIG. 10 is a timing diagram demonstrating the signals over time at various points in the oscillator depicted in FIGS. 7, 8, and 9;

FIG. 11 is a schematic representation of how the flip-flop and counter outputs from the schematics in FIGS. 8 and 9 are used to control a charge pump to generate a control voltage to lock the oscillator output to the ultrasonic delay time through silicon; and FIG. 12 is a cross-section view schematic representation of a piezoelectric stack, according to an embodiment.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known structures are omitted so as not to unnecessarily obscure the invention in detail. It should be understood, however, that the detailed description and the specific non-limiting examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

The apparatus and methods described herein detail several new architectures to enable a practical CMOS integrated clock generator. The methods described are pertinent to reducing the delay temperature dependence. As described herein, a CMOS with a temperature insensitive, stable, and calibrated oscillator is integrated with a piezoelectric transducer. An exemplary embodiment of a piezoelectric transducer 12 is shown as the piezoelectric stack 100 in FIG. 12 from PCT/US20/35537, which is assigned to the assignee hereof and incorporated herein by reference.

In FIG. 12, the transducer is shown fabricated on a CMOS substrate 107, 108, where FEOL refers to the transistor front-end-of-line CMOS layers 108 and BEOL refers to the back-end-of-line CMOS metallization layers 107. An insulator layer (such as silicon dioxide) 106 may be required to insulate the bottom electrode 102 from the CMOS top metal 107. The insulative layer 106 has metal vias 111 that connect the top-level connections in CMOS (e.g., CMOS BEOL layer 107) to the transducers through more layers of vias 110. These vias 111 connect the various metal layers electrically so that the receive transducer electrodes 102 can be cascaded in series. The vias 111 are also used to connect the transducer electrodes 102 to the CMOS metallization 107, 108 to connect to the CMOS circuits. The CMOS transistor layer 108 (CMOS FEOL layer 108) can sense and drive the piezoelectric transducers on the devices. The circuit can be connected to one of the piezoelectric transducers and can be used to drive an ultrasonic wave and pulse in the bulk of the silicon 109. The receive transducer can be connected to transistors for energy processing and generating a power source to power circuitry.

Figure 1:
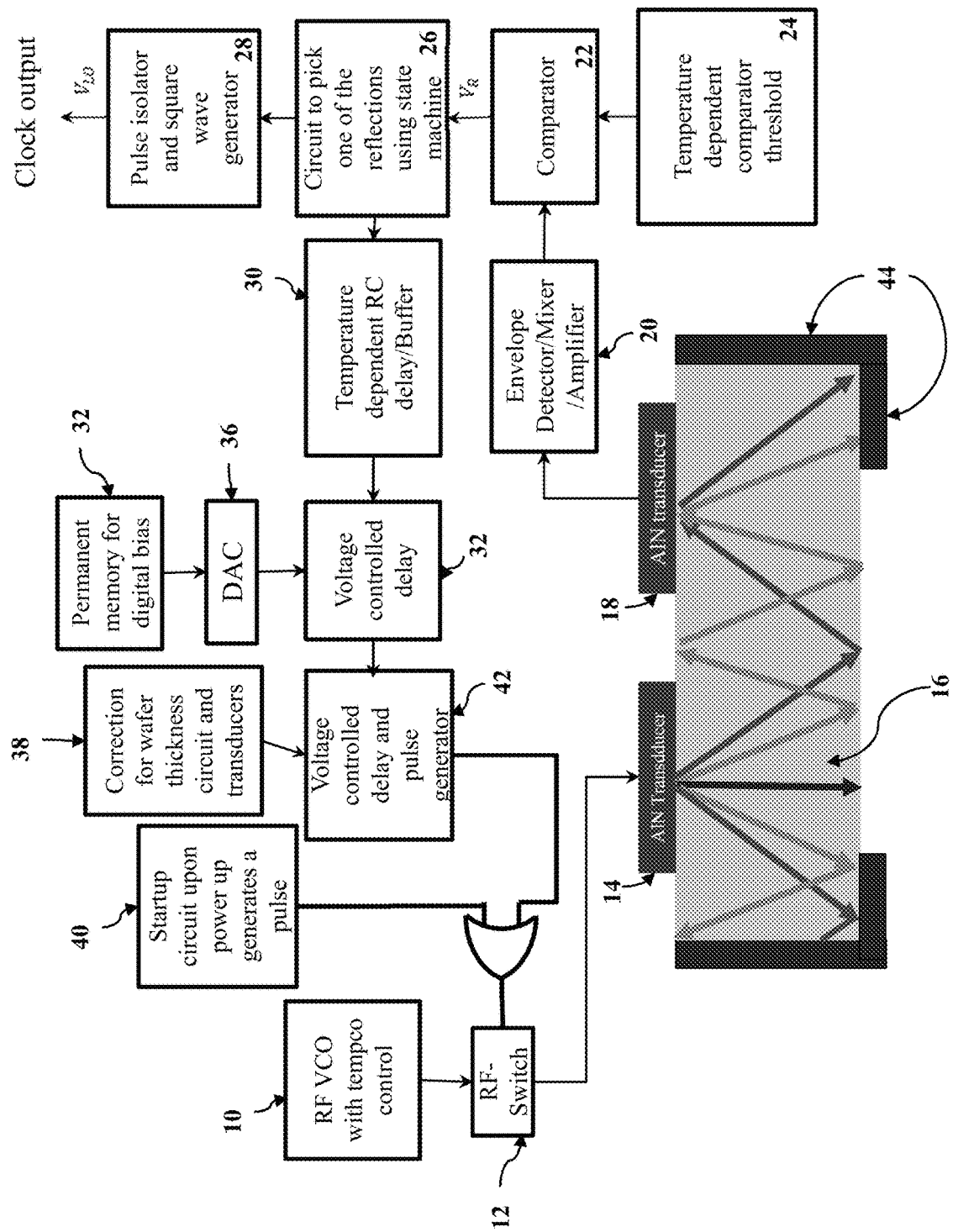
FIG. 1 is a schematic representation of a temperature insensitive oscillator system, according to an embodiment, using one of the received pulses to trigger the next cycle.
Figure 2:
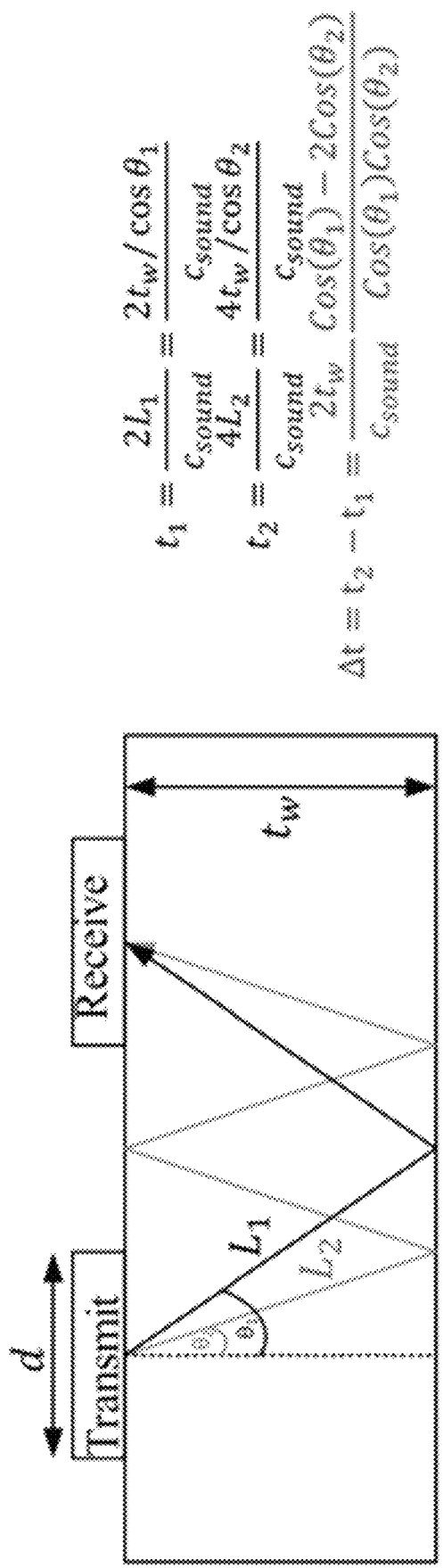
FIG. 2 is a schematic representation and equations for measuring multiple pulses corresponding to the diffraction-based pulses.

Referring now to FIG. 1, there is shown the overall architecture of various temperature insensitive oscillators. As shown in FIG. 1, upon power up, a startup circuit can generate a pulse 40. Using the pulse, a (voltage-controlled oscillator) VCO 10 generates a RF frequency that is gated (via gate 12) to a short pulse that is transmitted into a piezoelectric transducer 14 (on a silicon substrate 16) and then received at a receiver 18. The ultrasonic pulses are absorbed in a layer 44 around the chip (substrate 16). An absorbing material can be epoxy materials, potentially loaded with nanoparticles of metal, to absorb ultrasonic waves. A absorbing layer can be formed by spin-coating a film, followed by photolithography, to open areas where absorption is not desired. The coating can also be placed using dispensing mechanisms used to placed adhesives. Multiple pulses corresponding to the diffraction-based pulses can be measured, as shown in FIG. 2. The time of arrival difference between the two diffraction peaks can be analyzed based on first order analysis as shown in FIG. 2. The time difference between the two order is expected to be more stable over time, as any deviations owing to phase shifts in the RF VCO are present in both the diffraction orders. However, one can also pick one of the reflected pulses, to trigger the next ultrasonic RF pulse to repeat the cycle to form a stable oscillator. In this application, we describe both implementations with specific circuits.

The multiple RF pulses at the piezoelectric receiver are converted into square digital pulses that are used for generating the clock. The RF-pulse to square pulse conversion circuits consist of an envelope detector or a RF mixer 20. The envelope detector can be formed using a high-speed diode feeding into an amplifier. The amplified signal is then digitized through a comparator 22. The amplitudes of the different diffraction order pulses generate different voltages on the receiver are different, with the amplitude of the first order being higher than that of the second order. The comparator delay from pulse reception to trigger depends on the RF input pulse amplitude, as they comparator typically triggers when sufficient charge is present at the input to trigger a transistor. Furthermore, the comparator trigger delay can also be a function of temperature as the turn voltage and leakage current of rectifying circuits are temperature dependent. Temperature-dependent delay in the resulting digital output from the comparator can be achieved by using a temperature dependent comparator threshold 24) generator. The embodiments below describe different systems and methods to enable a calibrated, temperature stable clock 28.

In the circulating pulse oscillator, the oscillator frequency depends on the transit time of one of the diffraction orders. This has been demonstrated before by using one of the pulses of the signals is picked using a digital state machine 26. Various mechanisms to minimize the temperature sensitivity of the oscillator are described below.

In a second oscillator architecture, the time difference between two pulses can be used to form an oscillator as described below. According to the embodiment described below, a calibrated, temperature stable delay and clock are created through temperature dependent VCO frequency cancellation. The diffraction of the different orders results in two different angles of peaks $\theta_1$ and $\theta_2$ can be approximated by the equation $$\sin\theta_m = \frac{\left(m+\frac{1}{2}\right)\lambda}{d} = \frac{\left(m+\frac{1}{2}\right)c}{fd}.$$

Here, d is the width of a rectangular transducer array, c is the speed of sound in the silicon bulk and m is the order of the diffraction. The diffraction angles are reduced by increases in the drive frequency. In previous work, it has been described that as the temperature changes, the speed of sound is reduced with increasing temperature. The temperature coefficient of the speed of sound can be written as $c=c_0(1-\alpha\Delta T)$, where a is a positive value around $-50$ ppm/° C. for silicon, and can be a function of the crystalline orientation. The diffraction angles are inversely dependent on the frequency. Hence, the angle of diffraction can be kept invariant with temperature by reducing the frequency by the same amount as the speed of sound is decreased with temperature. As the diffraction angles change, the first and second orders arrive at the receiver at different times resulting in the temperature variation. The two different pulses arrive at two different times, and the difference between the two pulses can be used to control the oscillator frequency as this difference in time is very stable owing to the high-quality factor of the silicon wafer. As seen in the FIG. 3, the difference in the two times is $$\Delta t = t_2 - t_1 = \frac{2t_w}{c_{sound}} \frac{\cos(\theta_1)-2\cos(\theta_2)}{\cos(\theta_1)\cos(\theta_2)}.$$

As the temperature increases, the speed of sound decreases, and the angles also decrease as the angles are linearly proportional to the speed of sound. As the angles are reduced, the distance traveled by the diffraction orders is reduced and the difference between the two pulse times decreases as the two-angle difference becomes smaller. Using the small angle approximation for the angles which are small, one can write this expression as $$\Delta t = t_2 - t_1 = \frac{7}{4}t_w \frac{c_{sound}(1-\alpha\Delta T)}{f^2 a^2}.$$

Here, $\alpha$ is the absolute value of the speed of sound tempco. It is apparent from this expression that if the ultrasonic carrier frequency also decreases with temperature, then the overall change in time difference can be minimized. If we assume that $f=f_0(1-\beta\Delta T)$, then using the binomial expansion and keeping the first high-order-terms, we obtain:

$$\Delta t = t_2 - t_1 = \frac{7}{4}t_w \frac{c_{sound}(1-\alpha\Delta T)(1+2\beta\Delta T)}{f_0^2 a^2} \sim \frac{7}{4}t_w \frac{c_{sound}(1-(\alpha-2\beta)\Delta T)}{f_0^2 a^2}.$$

Figure 3:
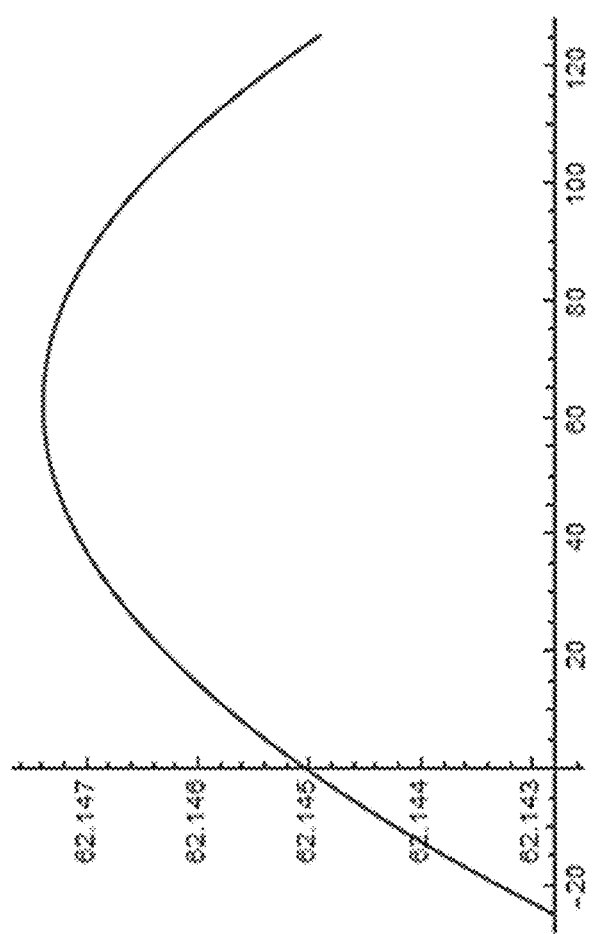
FIG. 3 is a graph showing the difference in arrival times of two different pulses.

If $\alpha=2\beta$, then the temperature dependence can be eliminated. Since this derivation is approximate, a numerical simulation was conducted in Mathematica. The delay expression with the Cosine terms was calculated without the small angle approximation, and a curve of frequency versus temperature as seen in FIG. 3 was obtained, achieving a small tempco of 0.667 ppm/K over the range of $-20°$ to $125°$ C.

To compensate for the diffraction angle change with temperature, the frequency of the ultrasonic pulses is changed. The carrier frequency of the ultrasound can be approximated at $f=f_0(1-\beta\Delta T)$ where $\beta$ is the coefficient of the carrier frequency. Hence, in order to design a carrier frequency with a specific temperature coefficient, one must consider the temperature coefficients from the different components. One of the main components is the VCO that generated the carrier frequency. Typical VCOs are ring oscillators consisting of digital inverters feeding into each other with a feedback loop. The inverters feed into charging the gate capacitance and wire capacitance of the next stage inverter. The inverter PMOS and NMOS transistors control the charging time and discharging times, respectively of the overall capacitance to be charged by the inverter. The saturation mode current through a NMOS transistor can be approximated as $$I_{DnSat} = \frac{1}{2}\mu_n C_{ox}\left(\frac{W}{L}\right)_n (V_{GS}-V_{TH_n})^2(1+\lambda V_{DD}).$$

Similarly, for the PMOS transistor the saturation current can be written as $$I_{DpSat} = \frac{1}{2}\mu_p C_{ox}\left(\frac{W}{L}\right)_p (|V_{GS}|-|V_{TH_p}|)^2(1+\lambda V_{DD}).$$

Figure 4:
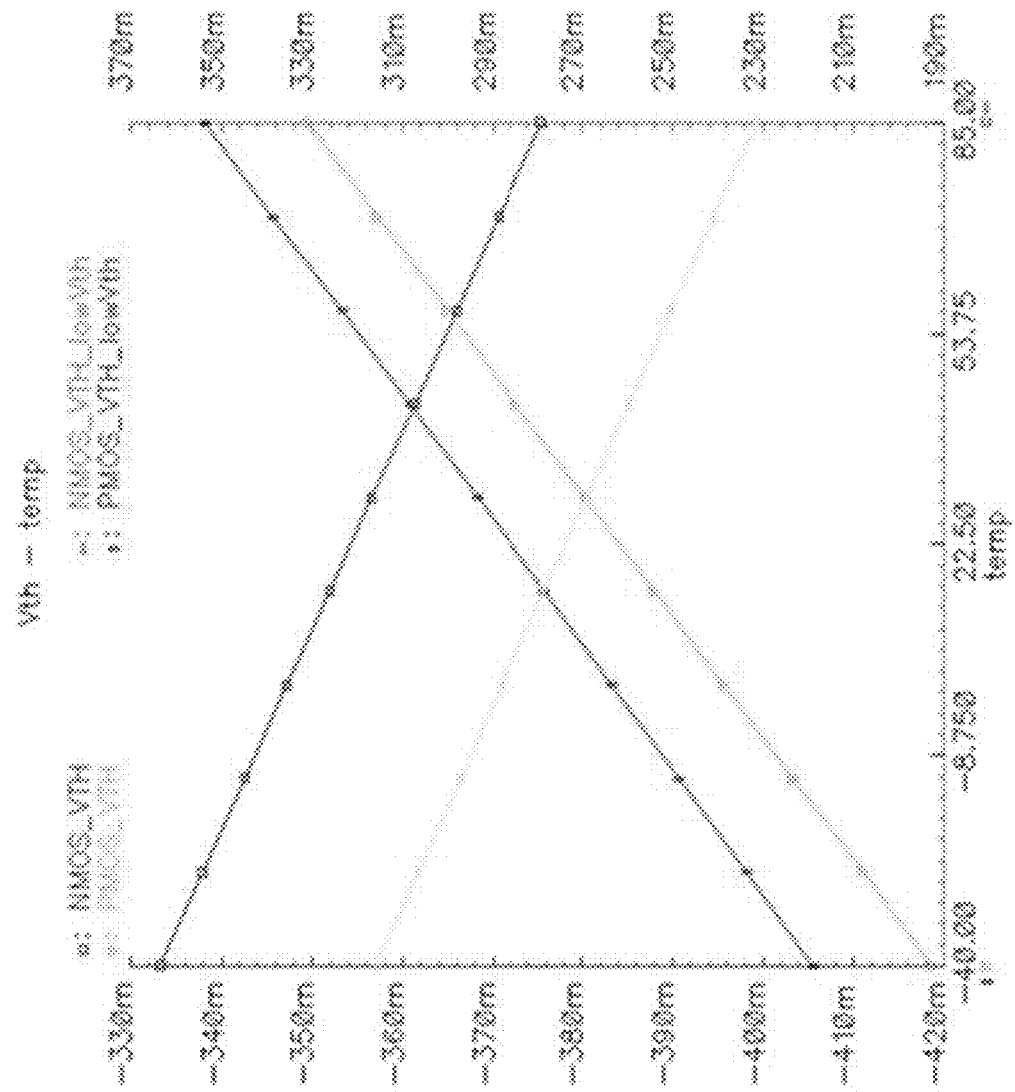
FIG. 4 is a graph showing the temperature coefficients of NMOS and PMOS transistor thresholds from −40° to 85° C. for a commercial CMOS fab.
Figure 5:
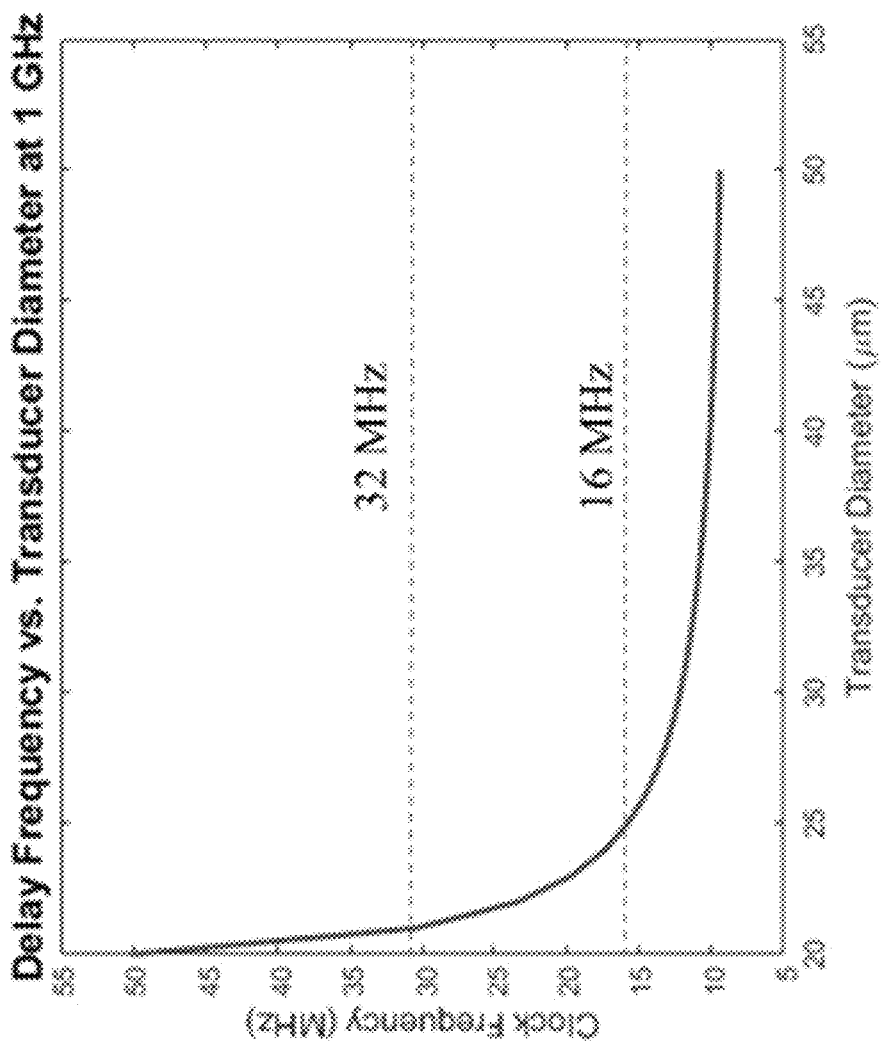
FIG. 5 is a graph showing the delay frequency as a function of transducer diameter.

The mobility of free carriers in n- and p-type doped silicon typically reduces with temperature. The threshold voltage of NMOS transistors decreases with temperature, while that for PMOS transistors increases, as seen in FIG. 4. This result implies that the ring-oscillator and hence the CVCO frequency can have an innate temperature coefficient. In FIG. 4, the temperature coefficients of NMOS and PMOS transistor thresholds are shown from $-40°$ to $85°$ C. for a commercial CMOS fab. In order to achieve a given tempco, one redesign the VCO with specific temperature dependent current controlling elements.

CMOS technology also consists of many thin films made of metals and semiconductors with different doping levels, that can be patterned as resistors. The temperature coefficient of the resistors can be positive or negative. For example, for diffused resistors, formed by diffusing n- or p-type dopants, temperature increase can increase the number of free carriers and decreases the electron or hole mobility. If the generation of carriers dominates compared to the decrease in mobility, then the resistivity decreases with increasing temperature, resulting in a negative temperature coefficient (tempco) of resistance. However, if the starting semiconductor is highly doped and nearly degenerate, or degenerate, then only the mobility decrease dominates, leading to an increase in resistance resulting in a positive tempco for the resistor. In any CMOS process, many kinds of resistors are available. For example, resistors can be made with diffusion of dopants in semiconductors with metal contacts where the metal-semiconductor contacts are ohmic. Another example of a resistor is that made of polysilicon which can be highly degenerate. If a series combination of a negative tempco of diffusion resistors and that of a polysilicon resistor are in series, one can program the effective tempco of an equivalent resistance. $R_{tot}=R_{d0}(1+\alpha_{dR}\Delta T)+R_{p0}(1+\alpha_{pR}\Delta T)=R_{d0}+R_{p0}+(R_{d0}\alpha_{dR}+R_{p0}\alpha_{pR})\Delta T$.

This approach for tuning the tempco for a VCO oscillator has been implemented. In a configuration of a ring oscillator, a bias voltage can be used to control the current through the inverters by having the PMOS and NMOS transistors in series with the inverters. This configuration of a VCO is often called a current-starved VCO. The resistive divider current source can be designed to produce a bias that changes with temperature to feed into the current starving transistors of the VCO. This voltage bias, as it changes with temperature, owing to the change in the resistance, will control the rate at which the ring-oscillator inverters charge and discharge, obtain a desired temperature coefficient of the VCO frequency. By using a diffusion resistor and a polysilicon resistor in series in the right proportion, a desired temperature coefficient of the VCO can be obtained. In addition to tuning the current source dependence on temperature using different resistors, and the threshold voltage dependence on temperature, we implement a VCO with the correct temperature dependence of output frequency to make the temperature dependence of the ultrasonic delay element to be a controllable value.

According to the embodiment described below, temperature dependent delays are used to compensate with temperature dependence of the envelope detector, comparator, and digital logic. To form the oscillator 10 using the ultrasonic pulse stable time delay, a control loop to add and reduce delay in the electronic domain is formed that can include several components. The pulse being received on the receive transducer 18 can be detected by a mixer receiver or a simpler diode-like envelope detector 20. In the mixer detector 20, the RF pulse signal is multiplied with the received signal, resulting in a low-noise detector by canceling out any out-of-band RF energy.

In the diode-based RF energy detector (often also referred to as a "demodulator") 20, the positive swings of the RF input are rectified into a capacitor. A full-bridge rectifier is used to extract the energy in the negative cycle of the RF cycle. Hence, a net voltage builds up on the capacitor, which can be used to determine if a signal is received at the receiver. The voltage on the capacitor can be a function of temperature because the diode current is a function of temperature. Hence, the output voltage and the time at which the voltage peaks will be a function of the different components used to implement the envelope detector. The envelope detector 20 can be made not only of PN junctions in CMOS, but also diode connected PMOS, NMOS, and BJT transistors.

Following the envelope detector 20, a base-band voltage pulse is generated that can be further amplified. The pulses are processed into a comparator 22, which generates a digital voltage close to the supply voltage of the circuit. The digital-like output from the comparator 22 can then be used to generate the next ultrasonic pulse to form the oscillator 10. The comparator 22 itself can have a time delay in placing the digital output as a function of the input voltage difference between the input and the threshold voltage. This time delay $\tau_{comparator}$ can have a temperature dependence that can change the time output frequency of the oscillator.

In order to control the comparator delay, a resistive divider, made of positive and negative tempco resistors, can be used to provide threshold voltages that can change with the threshold such that the comparator output can be adjusted automatically as a function of temperature. A voltage divider made of two resistors $R_1$ and $R_2$, $R_2$ connected to ground and $R_1$ connected to $V_{DD}$ produces a voltage that is:

$$V_{out} = \frac{V_{DD} * R_{20}(1+\alpha_2\Delta T)}{R_{10}(1+\alpha_1\Delta T)+R_{10}(1+\alpha_1\Delta T)} = V_{DD}\frac{1}{1+\frac{R_{10}(1+\alpha_1\Delta T)}{R_{20}(1+\alpha_2\Delta T)}} \sim$$

$$V_{DD}\frac{1}{1+\frac{R_{10}(1+\alpha_1\Delta T-\alpha_2\Delta T)}{R_{20}}} \sim V_{DD}\frac{(1+(\alpha_2-\alpha_1)\Delta T)}{1+\frac{R_{10}}{R_{20}}}.$$

These approximations are made using the binomial approximations. By controlling the composition of both $R_1$ and $R_2$ made of diffusion and poly/metal resistors, we can design a bias for the comparator that results in a desired tempco.

The digital pulse generated after the comparator 22 may still need another temperature-controlled delay to obtain a desired oscillator frequency. In order to achieve this delay, a second RC delay 30 between two inverters, followed by an inverter buffer 30 can be used. Here, the R of the RC delay can be again composed of resistors with predictable temperature coefficients. The delay R can also be made of transmission gates made of NMOS and CMOS transistors that yield a desired temperature coefficient.

The thickness of the wafer 16 is controlled by polishing, and owing to variance in polishing, the thickness cannot be easily controlled to ppm level accuracy at low cost. Typically, a few microns of thickness error will be present corresponding to a few nanosecond delay that can change the oscillation frequency. Every micron corresponds to ~0.1 ns delay given the speed of sound in silicon is ~9000 m/s. In order to compensate for the errors in wafer thickness and other adjustments in the circuit, a RC delay 32 with a transistor gate (parallel connection of appropriately sized PMOS and NMOS transistors) as a voltage-controlled resistance can be used to add delay. The analog signal to control this delay can be generated from a permanent memory on chip, that is converted into an analog signal using a digital to analog converter 36.

The embodiment described below details the method of programming the frequency using RF or wired input clock. The voltage needed to control the fixed delay can be generated by sensing the input RF frequency over a channel (either RF fed signal or wired signal) that is divided down, using a counter or fractional PLL, to the desired frequency of the oscillator 10. This can be especially useful in a training mode during production where each wafer can be exposed to a precise RF signal where the RF signal is fed to the entire wafer. The RF signal is harvested, using integrated capacitive or inductive antennas, to power each chip to calibrate its clock frequency. Note that since the programming power can be high, the antennas can be very small commensurate with the size of the oscillator part of the CMOS chip. For example, the wifi or BLE signals can be received and amplified, using power generated though the RF energy harvester, and fed into a digital counter to down count the number of RF cycles to result in a reference clock, against which the US pulse based oscillator can be compared against.

Once this frequency is obtained, the onboard frequency can then be compared using a frequency-phase detector. This correction digital value required to match the absolute frequency can be stored in a permanent memory on CMOS which can include electrical fuses.

Figure 6:
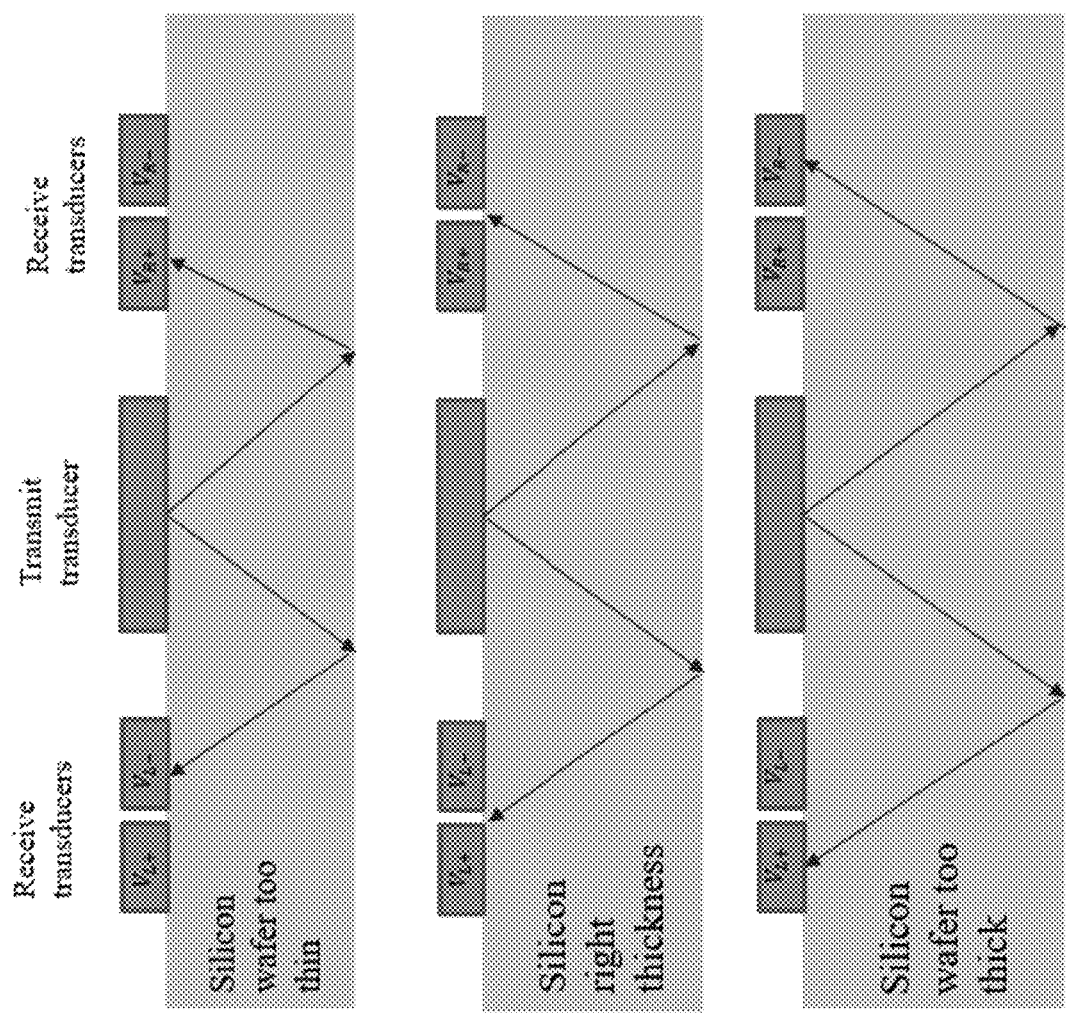
FIG. 6 is a schematic representation of CMOS wafer thickness and the positioning of the received pulse.

A second method for thickness calibration can also be integrated. The embodiment described below details the method of programming the frequency using on-chip calibration using differential sensing of the US pulses. The feature dimensions on top of the CMOS chip can be defined using DUV lithography with accuracies to sub-micron level, and the relative matching of features close to each other on the chip can be very high. By laws of ultrasonic wave propagation, the reflected ultrasonic pulses at angles governed by diffraction, received on the receive pixel, will be a function of the wafer thickness 38, as shown in FIG. 6. If the wafer thickness is too thick, then the received pulse will be on the right of the receiver as the path of travel is longer. If the wafer thickness is too thin, then the pulse received is on the left of the transducer. To calibrate the wafer thickness, the receive transducer can be split into two or more transducers connected in a way to measure the difference in the receive transducers using CMOS circuits to amplify the difference using commonly available differential amplifier topologies. The area of the two neighboring receive transducers may need to be different to account for the different distance from the transmitter and the US pulse arriving at the farther electrode being smaller. The difference signal can be conditioned, using analog or digital approaches, to calculate the effective error of the wafer thickness. The difference in the output serves as an error signal to feed into the voltage controlled delay RC element 42 formed with a transmission-gate resistor and a fixed capacitor. 42 also will consist of a short pulse generator corresponding to the width of the RF pulse transmitted, typically in the 50-75 ns range. The oscillator frequency is the reciprocal of the total time delay, the acoustic delay and the electronic delay.

In order to implement an oscillator based on the difference in timing of two return pulses, a specific architecture is described below.

In this architecture, shown in FIGS. 7, 8, 9, 10, and 11, the architecture described above is used to generate the different return pulses, but also fed into a flip-flop. Two VCOs are used in the delay-based oscillator. The first VCO, which is referred to as the RF VCO 410 (FIG. 7), is a VCO used to generate the RF frequency used to excite the transducers at their resonance frequencies. The frequency of this VCO is temperature compensated as described above to minimize temperature variance of the delay.

The second VCO, which will be referred to as the local oscillator VCO, is a lower frequency VCO (FIG. 9)—the frequency of the VCO is chosen such that the period of the clock generated by this VCO is 2 times the transit time of two acoustic echoes generated by a transmit transducer and received by a receive transducer. An example frequency is $2^{16}$ cycles per second, or 65.5 MHz, with a period of 15.6 uS. This second VCO can be implemented as a ring oscillator, as shown in FIG. 9. The VCO that is locked by the feedback loop—the control voltage $V_{C_{LO}}$ is generated by the feedback loop as will be discussed below. The output of this local oscillator VCO is referred to as $V_{LO}$ and is the clock output of the oscillator 28 (FIG. 7).

As shown in FIG. 9, the output of this local oscillator with a square wave output is fed into a counter. A 3 bit counter 214 is shown as an example. The 2 least-significant bits (LSB) of the counter output are fed into an AND gate 206 to generate a pulse that generates a pulse with a frequency that is ¼ of the electronic clock. As shown in FIG. 9, the AND gate is configured with inverted inputs, that turns on when two least significant bits, b0 and b1 are zero. The output of this AND gate can be called $V_{fdiv4}$, and its inverse $\overline{V_{fdiv4}}$ is generated using an inverter. All of the counter bits are also fed into a second, three input AND gate 204, to generate a pulse that can be called $V_{fdiv8}$ signal, which is fed through an inverter to generate its inverse, $\overline{V_{fdiv8}}$. The $V_{fdiv8}$ signal is used to generate a trigger pulse, ~50 ns wide, that gates the RF VCO into the transmit transducer. This short trigger pulse is generated by driving an AND gate 304 with the signal and its delayed version using a RC 306, 308 delay circuit associated with a delay $\tau_{RC}$ (FIG. 7).

The excitation of the transmit transducer by the RF pulse generated by the RF switch creates an ultrasonic pulse that travels through the silicon while diffracting. The ultrasonic pulses are reflected off the bottom surface of the silicon and travels back to the top side of the silicon where they are received by the receive transducer. The multiple bounces of this ultrasonic pulse due to reflection from the top and bottom surfaces of the silicon manifest as multiple echoes in the receive voltage waveform.

The delay time for each echo from the initial transmit time is proportional to $N\Gamma_N 2L/c$ where c is the speed of sound and L is the wafer thickness, N is the echo number, and $\Gamma_N$ is a correction term used to account for the variation in transit time due to diffraction.

The received ultrasonic echoes are converted into a digital signal by the following steps: 1) the received echoes from the transducer are fed into an amplifier, followed by an envelope detector in order to downconvert the signal from a RF pulse to a baseband pulse; 2) the pulse output from the envelope detector is converted to a digital signal using a comparator or a high gain amplifier (FIG. 7.).

The digital signal generated, containing the multiple reflections received in the receive transducer, from the reflections are then fed into a D flip-flop. As the reflections arrive, the D flip-flop (FF) turns on and off at rising edges of the consecutive pulses arriving, producing a signal $V_{FF}$. The D flip-flop (FF) turns on with the arrival of a new pulse, and turns off with the next pulse, creating a pulse that is on for the duration corresponding to the time difference between the two pulses. This pulse then is fed through the different time adjusting components 338, 332, 330 in FIG. 8. Here the output of the FF 302 is fed into the control circuits for the delays to turn off the delay if the FF output is high, such that the delays are applied only when the transition of the FF is from 0 to 1, therefore effecting the time difference between the delays.

The D flip-flop is connected to be reset by the $V_{fdiv8}$ signal, thus ensuring that the output of the D flip-flop is zero when the digital signals corresponding to the reflections arrive (FIG. 8).

For the purpose of forming the oscillator we assume that the D flip-flop pulse output ($V_{FF}$) is aligned in time roughly with the of the $V_{fdiv4}$ signal from the local oscillator. This alignment can be achieved by adjusting the nominal operating frequency of the oscillator. A timing diagram corresponding to the signals is shown in FIG. 10. The $V_{fdiv8}$ is triggers the main ultrasonic pulse shown on the top trace. The trigger leads to the multiple reflections from the receive transducer. The resulting $V_{FF}$ can overlap with the $V_{fdiv4}$ sufficiently for feedback control adjustment. Since the objective of the locked oscillator is to adjust the local oscillator frequency such that the pulse width is the pulse width corresponding to the pulse difference between two reflections, we need a circuit to adjust the local VCO oscillator frequency as a function of the difference.

A phase detector can be used to generate a signal proportional to the time difference. The phase detector has the $V_{fp}$ and the $V_{fdiv4}$ signals as inputs. This circuit produces an output on the 'U' signal if $V_{fp}$ is ahead of $V_{fdiv4}$, and 'D' if $V_{fp}$ is behind $V_{fdiv4}$. A second phase detector is implemented with $\overline{V_{fp}}$ and $\overline{V_{fdiv4}}$ that generates the corresponding 'U' and 'D' signals. The U and D signals from this second phase detector are fed into an OR gate with the D and U signals of the first phase detector as shown in FIG. 11. The output of the OR gates fed to a charge pump. As can be seen there are four possibilities of timing errors between the $V_{fdiv4}$ and $V_{fp}$ signals. For each of the cases the output voltage either corrects the VCO frequency or stays at the right frequency even with small amount of shift between the $V_{fdiv4}$ and $V_{fp}$ signals. The output of this charge pump ($V_{Err}$) is used in conjunction with additional voltage to control the local oscillator VCO ($V_{C_{LO}}$) to control the frequency. For example, $V_{C_{LO}}$ can be formed by the addition of the $V_{Err}$ signal and another biasing voltage using an op-amp circuit shown as a block 210.

While embodiments of the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. An oscillator with minimized dependence on temperature, comprising:
   a voltage-controlled oscillator VCO generating a RF frequency, which is transmitted as a plurality of short pulses to a piezoelectric transducer;
   a piezoelectric receiver spaced from the piezoelectric transducer and configured to receive the plurality of short pulses;
   an RF envelope detector or RF mixer configured to convert the plurality of short pulses to an amplified signal; and
   a comparator configured to digitize the amplified signal and add temperature-dependent and programmed fixed delays.

2. The system of claim 1, wherein the piezoelectric transducer and piezoelectric receiver are integrated on a CMOS device.

3. The system of claim 2, wherein the CMOS device has a thickness such that the plurality of short pulses are received between two piezoelectric receivers.

4. The system of claim 2, wherein the CMOS device is on a substrate composed of a flexible, stretchable material.

5. The system of claim 4, wherein the substrate is composed of at least one of a silicon wafer, SiC wafer, and, a silica wafer.

6. The system of claim 2, further comprising an error signal generated by the piezoelectric transducer, wherein the error signal corresponds to an error in thickness of the CMOS device.

7. The system of claim 1, wherein the piezoelectric transducer and the piezoelectric receiver as spaced corresponding to a change in temperature dependence.

8. A temperature insensitive oscillator system, comprising:
   a substrate having a first surface and an opposing second surface;
   a CMOS device comprising one or more CMOS circuits attached to the first surface of the substrate;
   one or more piezoelectric transducers attached to an outer surface of the CMOS device;
   a voltage-controlled oscillator generating a RF frequency, which is transmitted as a plurality of short pulses to the one or more piezoelectric transducers; and
   one or more resistors are arranged alongside the piezoelectric transducers or on the CMOS device such that the voltage-controlled oscillator has a controllable temperature dependence.

9. The system of claim 8, wherein the one or more resistors provide temperature coefficients.

10. The system of claim 8, further comprising a comparator configured to digitize the amplified signal and add temperature-dependent and programmed fixed delays.

11. The system of claim 10, wherein the comparator is connected to a voltage reference with a desired voltage versus temperature, such that the comparator obtains a desired comparator delay versus temperature.

12. The system of claim 8, further comprising a RC delay element configured to add or subtract a delay in a circuit of the voltage-controlled oscillator to control the frequency of a feedback loop voltage-controlled oscillator.

13. The system of claim 8, wherein the RC delay element is a voltage-controlled transmission gate.

14. The system of claim 10, wherein a voltage needed to control the fixed delays to get a correct frequency is received by a memory connected to the voltage-controlled oscillator.

15. The system of claim 10, wherein the programmable delay is determined by sensing a RF frequency over a channel, and using a power and a carrier in a resulting signal to determine a difference between a local oscillator and the RF carrier frequency.

16. An oscillator with minimized dependence on temperature, comprising:
   a substrate having one or more transducers;
   a first oscillator configured to generate a RF frequency which excites the one or more transducers at their respective resonance frequencies;
   wherein the one or more transducers generate a sequence of RF pulses due to ultrasonic propagation in the bulk and transduction; and a second oscillator that is a voltage-controlled ring oscillator and having a frequency based on the difference between two of the RF pulses generated by the one or more transducers.

17. The system of claim 16, wherein the difference between two ultrasonic received pulses is modified by temperature dependent, fixed, and programmable time delays.

18. The system of claim 17, wherein the programmable time delays are determined by sensing a RF frequency over a channel, and using a power and a carrier in a resulting signal to determine a difference between the second oscillator and the RF carrier frequency, and is stored on a chip.

19. An oscillator with minimized dependence on temperature, comprising:
   a substrate having one or more transducers;
   a first oscillator configured to generate a RF frequency which excites the one or more transducers at their respective resonance frequencies;
   wherein the one or more transducers generate a sequence of RF pulses due to ultrasonic propagation in the bulk and transduction, wherein the difference between two ultrasonic received pulses is modified by temperature dependent, fixed, and programmable time delays; and
   a second oscillator having a frequency based on the difference between two of the RF pulses generated by the one or more transducers.

20. The system of claim 19, wherein the programmable time delays are determined by sensing a RF frequency over a channel, and using a power and a carrier in a resulting signal to determine a difference between the second oscillator and the RF carrier frequency, and is stored on a chip.

* * * * *